(12) United States Patent
Takeuchi

(10) Patent No.: US 12,133,330 B2
(45) Date of Patent: Oct. 29, 2024

(54) WIRING SUBSTRATE AND SEMICONDUCTOR DEVICE

(71) Applicant: SHINKO ELECTRIC INDUSTRIES CO., LTD., Nagano (JP)

(72) Inventor: Akihiro Takeuchi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 256 days.

(21) Appl. No.: 18/047,348

(22) Filed: Oct. 18, 2022

(65) Prior Publication Data

US 2023/0130183 A1 Apr. 27, 2023

(30) Foreign Application Priority Data

Oct. 26, 2021 (JP) .................................. 2021-174579

(51) Int. Cl.
*H05K 1/11* (2006.01)
*H05K 1/09* (2006.01)
*H05K 1/18* (2006.01)

(52) U.S. Cl.
CPC .............. *H05K 1/113* (2013.01); *H05K 1/09* (2013.01); *H05K 1/181* (2013.01); *H05K 2201/0376* (2013.01); *H05K 2201/09227* (2013.01); *H05K 2201/096* (2013.01); *H05K 2201/09736* (2013.01); *H05K 2201/10674* (2013.01)

(58) Field of Classification Search
CPC ....................... H05K 1/113; H05K 2201/0376
See application file for complete search history.

(56) References Cited

U.S. PATENT DOCUMENTS

| 9,018,539 B2 * | 4/2015 | Lee ...................... H05K 3/0035 |
| | | 174/262 |
| 2010/0314254 A1 | 12/2010 | Kodani |
| 2012/0006591 A1 * | 1/2012 | Kaneko ............... H01L 21/6835 |
| | | 29/829 |
| 2013/0062108 A1 * | 3/2013 | Kondo ................... H05K 3/388 |
| | | 977/932 |
| 2014/0168920 A1 * | 6/2014 | Hondo ................... H05K 3/306 |
| | | 29/834 |
| 2016/0198568 A1 * | 7/2016 | Park ..................... H05K 3/4682 |
| | | 174/262 |
| 2016/0276255 A1 | 9/2016 | Ota et al. |
| 2020/0294903 A1 * | 9/2020 | Sakurai ............ H01L 23/49894 |

FOREIGN PATENT DOCUMENTS

| JP | 2010-287742 | 12/2010 |
| JP | 2016-178247 | 10/2016 |

* cited by examiner

*Primary Examiner* — Sherman Ng
(74) *Attorney, Agent, or Firm* — IPUSA, PLLC

(57) ABSTRACT

A wiring substrate includes an insulating layer, a pad in a via hole piercing through the insulating layer and exposed at a first surface of the insulating layer, a via conductor on the pad in the via hole, and a wiring part on a second surface of the insulating layer facing away from the first surface. The wiring part is connected to the pad through the via conductor in the via hole.

14 Claims, 7 Drawing Sheets

WIRING SUBSTRATE AND SEMICONDUCTOR DEVICE

CROSS-REFERENCE TO RELATED APPLICATION

This application is based upon and claims priority to Japanese Patent Application No. 2021-174579, filed on Oct. 26, 2021, the entire contents of which are incorporated herein by reference.

FIELD

A certain aspect of the embodiments discussed herein is related to wiring substrates and semiconductor devices.

BACKGROUND

Pads for flip chip bonding are provided on a wiring substrate for mounting a semiconductor device by flip chip bonding. The pads for flip chip bonding are formed by electroplating. (See Japanese Laid-open Patent Publication Nos. 2010-287742 and 2016-178247.)

SUMMARY

According to an aspect of the invention, a wiring substrate includes an insulating layer, a pad in a via hole piercing through the insulating layer and exposed at a first surface of the insulating layer, a via conductor on the pad in the via hole, and a wiring part on a second surface of the insulating layer facing away from the first surface. The wiring part is connected to the pad through the via conductor in the via hole.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
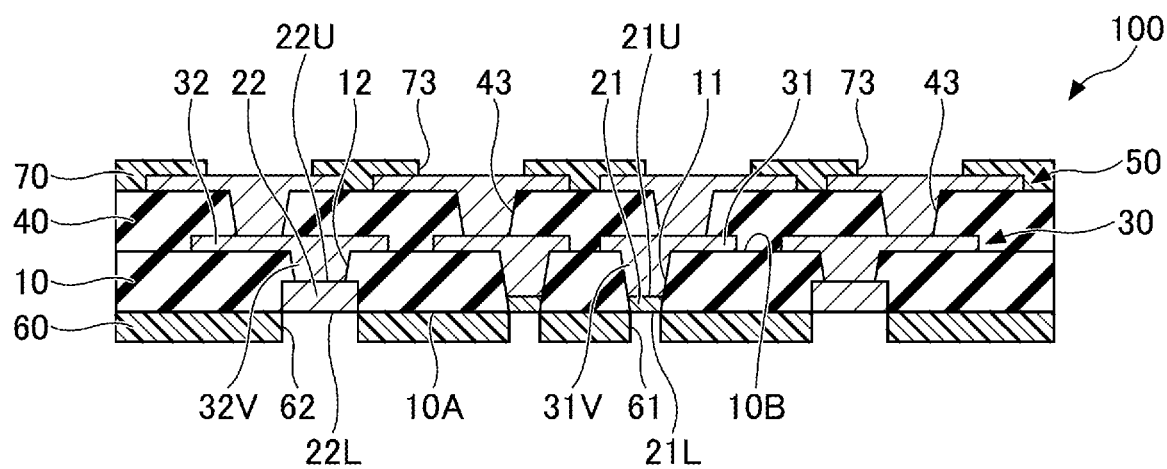
FIG. 1 is a sectional view of a wiring substrate according to a first embodiment, showing its structure.

As the degree of integration of semiconductor devices increases, the miniaturization of pads provided on a wiring substrate is desired.

According to an aspect of the present disclosure, it is possible to miniaturize pads in a wiring substrate and a semiconductor device.

According to an aspect of the present disclosure, a wiring substrate and a semiconductor device with miniaturized pads are provided.

Embodiments of the present disclosure are specifically described below with reference to the accompanying drawings. In the specification and drawings, constituent elements having substantially the same functional configuration may be referred to using the same reference numeral and a duplicate description thereof may be omitted. According to the present disclosure, for convenience, the side of a wiring substrate on which side a semiconductor element is to be mounted is referred to as "first side" or "lower side," and the opposite side of the wiring substrate is referred to as "second side" or "upper side." Furthermore, a surface of the wiring substrate on which a semiconductor element is mounted is referred to as "first surface" or "lower surface," and the opposite surface of the wiring substrate is referred to as "second surface" or "upper surface." The wiring substrate and a semiconductor device including the wiring substrate, however, may be used in an inverted position or oriented at any angle. Furthermore, a plan view refers to a view of an object from the direction of a normal to the first surface of the wiring substrate or the semiconductor device, and a planar shape refers to the shape of the object as viewed from the direction of the normal to the first surface of the wiring substrate or the semiconductor device.

[a] First Embodiment

First, a first embodiment is described. The first embodiment is directed to a wiring substrate.

A structure of a wiring substrate is first described. FIG. 1 is a sectional view of a wiring substrate according to the first embodiment, showing its structure.

Referring to FIG. 1, a wiring substrate 100 according to the first embodiment includes a first insulating layer 10 that has a first surface 10A and a second surface 10B. The first surface 10A is a lower surface and the second surface 10B is an upper surface. First via holes 11 and second via holes 12 are formed in the first insulating layer 10. For example, the first via holes 11 and the second via holes 12 have a circular planar shape. Each of the first via holes 11 pierces through the first insulating layer 10 to have a first end and a second end at the first surface 10A and the second surface 10B, respectively. Each of the second via holes 12 does not pierce through the first insulating layer 10 to have a first end at an upper surface (a surface on the second surface 10B side) 22U of a matching one of second pads 22 as described below and a second end at the second surface 10B. For example, the first via holes 11 and the second via holes 12 are approximately 50 μm to approximately 80 μm in diameter. For example, the second via holes 12 are formed around the first via holes 11 in a plan view.

The wiring substrate 100 includes first pads 21. The first pads 21 are provided one in each of the first via holes 11. The first pads 21 are exposed at the first surface 10A. Each of the first pads 21 has a lower surface 21L that is flush with the first surface 10A. Each of the first pads 21 has a side surface that is in contact with the inner wall surface of the matching first via hole 11. The first pads 21 and the first via holes 11 are substantially equal in diameter. For example, the first pads 21 are approximately 50 μm to approximately 80 μm in diameter. The first pads 21 include, for example, a gold film, a palladium film, and a nickel film that are stacked in order from the first surface 10A side to the second surface 10B side. In this case, the gold film is exposed at the first surface 10A. For example, the first pads 21 are approximately 3 μm to approximately 5 μm in total thickness.

The wiring substrate 100 includes the second pads 22. The second pads 22 are exposed at the first surface 10A. Each of the second pads 22 has a lower surface 22L that is flush with the first surface 10A. For example, the second pads 22 are formed around the first pads 21 in a plan view. The second via holes 12 are so formed as to reach the respective connecting portions (upper surfaces 22U) of the matching second pads 22. The second pads 22 are larger in diameter than the second via holes 12. Furthermore, the second pads 22 are larger in diameter than the first pads 21. For example, the second pads 22 are approximately 100 μm to approximately 150 μm in diameter. The second pads 22 are, for example, an electrolytic copper plating film. The second pads 22 are thicker than the first pads 21. For example, the second pads 22 are approximately 5 μm to approximately 15 μm in thickness.

The wiring substrate 100 includes a first wiring layer 30 formed on the first insulating layer 10. The first wiring layer 30 includes a first wiring part 31 and a second wiring part 32. The first wiring part 31 is connected to the first pads 21 through first via conductors 31V in the first via holes 11. The second wiring part 32 is connected to the second pads 22 through second via conductors 32V in the second via holes 12. The entirety of an upper surface 21U of each first pad 21 contacts the matching first via conductor 31V. For example, the entirety of the upper surface of the nickel film included in the first pad 21 contacts the first via conductor 31V. Part of the upper surface 22U of each second pad 22 contacts the matching second via conductor 32V, and the rest of the upper surface 22U of the second pad 22 contacts the first insulating layer 10.

At the interface between each first pad 21 and the matching first via conductor 31V, the first pad 21, the first via conductor 31V, and the corresponding first via hole 11 are equal in diameter. Furthermore, at the interface between each second pad 22 and the matching second via conductor 32V, the second via conductor 32V and the corresponding second via hole 12 are equal in diameter, and the surface of the second via conductor 32V that contacts the second pad 22 is smaller in diameter than the upper surface 22U of the second pad 22.

A second insulating layer 40 is formed on the first insulating layer 10. Third via holes 43 that reach the connecting portion of the first wiring layer 30 are formed in the second insulating layer 40. A second wiring layer 50 connected to the first wiring layer 30 through via conductors in the third via holes 43 is formed on the second insulating layer 40.

A solder resist layer 60 is formed on the first surface (lower surface) 10A of the first insulating layer 10. A solder resist layer 70 is formed on the upper surface of the second insulating layer 40. First openings 61 that reach the first pads 21 and second openings 62 that reach the second pads 22 are formed in the solder resist layer 60. Third openings 73 that reach the connecting portion of the second wiring layer 50 are formed in the solder resist layer 70.

When the wiring substrate 100 thus configured is in use, a semiconductor device is mounted on the wiring substrate 100 by flip chip bonding such that electrodes of the semiconductor device are connected to the first pads 21 via bumps, for example.

Figure 2A:
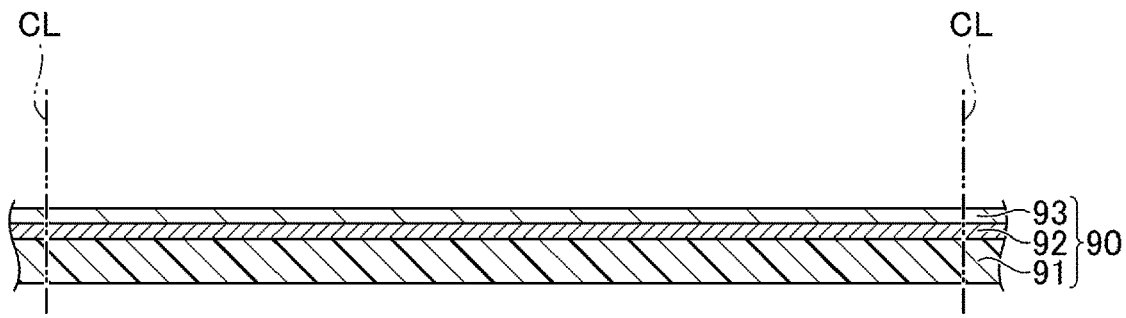
FIGS. 2A through 2Q are sectional views illustrating a method of manufacturing a wiring substrate according to the first embodiment.

Next, a method of manufacturing a wiring substrate according to the first embodiment is described. FIGS. 2A through 2Q are sectional views illustrating a method of manufacturing a wiring substrate according to the first embodiment.

First, as illustrated in FIG. 2A, a support substrate 90 is prepared. The support substrate 90 includes, for example, a prepreg base 91, carrier copper foil 92, and copper foil 93. The carrier copper foil 92 is provided on the base 91, and the copper foil 93 is provided on the carrier copper foil 92 via a release layer (not depicted). The base 91 is, for example, a woven or non-woven fabric of glass fibers, aramid fibers or the like impregnated in advance with a thermosetting epoxy resin, polyimide resin or the like. For example, the carrier copper foil 92 is approximately 10 μm to approximately 50 μm in thickness, and the copper foil 93 is approximately 1.5 μm to approximately 5 μm in thickness.

A large-size support substrate from which multiple wiring substrates 100 can be obtained is used as the support substrate 90. That is, the support substrate 90 includes multiple regions in each of which a structure corresponding to the wiring substrate 100 is to be famed. After making a single member to become multiple wiring substrates 100, the member is cut along cutting lines CL to be divided into individual wiring substrates 100. For convenience of description, a part to ultimately become a constituent element of the wiring substrate 100 is referred to using the reference numeral of the constituent element.

Figure 2B:
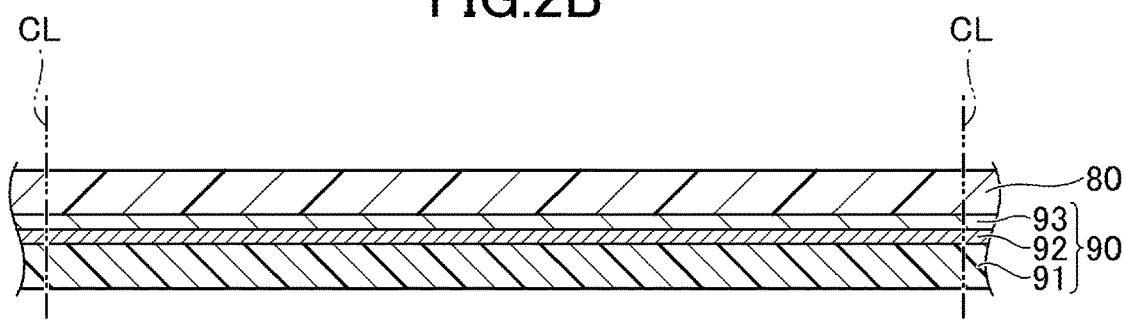

Next, as illustrated in FIG. 2B, a photosensitive plating resist layer 80 is formed on the entirety of the upper surface of the copper foil 93. For example, a dry film resist or the like may be used as the plating resist layer 80.

Figure 2C:
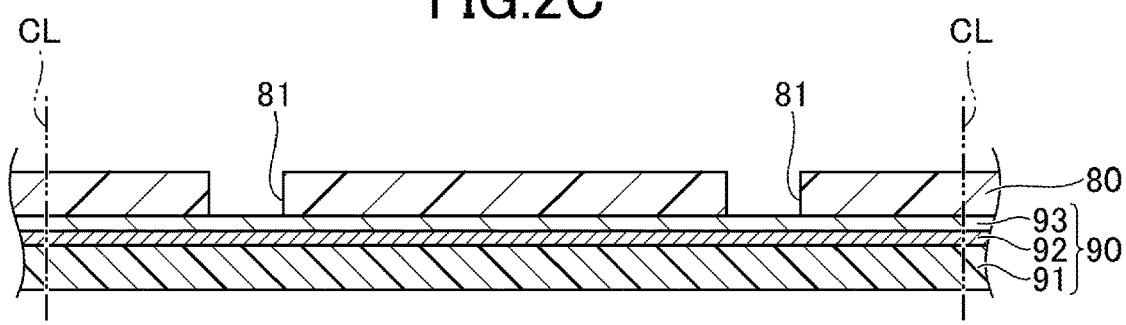

Thereafter, as illustrated in FIG. 2C, the plating resist layer 80 is exposed to light and developed, so that openings 81 to expose parts where the second pads 22 are to be famed are formed in the plating resist layer 80. The openings 81 are approximately 100 μm to approximately 150 μm in diameter.

Figure 2D:
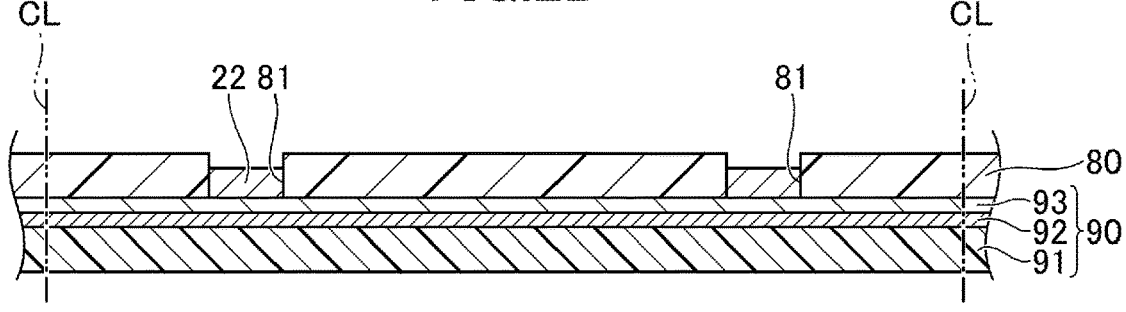

Next, as illustrated in FIG. 2D, an electrolytic copper plating film is formed on the upper surface of the copper foil 93 exposed in the openings 81 as the second pads 22 by electroplating using the copper foil 93 as a power supply channel for plating. The temperature of an electroplating solution used for forming the second pads 22 is, for example, approximately 40° C. to approximately 50° C. The plating resist layer 80 has sufficient resistance to a plating solution of approximately 40° C. to approximately 50° C. For example, the second pads 22 are approximately 5 μm to approximately 15 μm in thickness. The second pads 22 are equal in diameter to the openings 81.

Figure 2E:
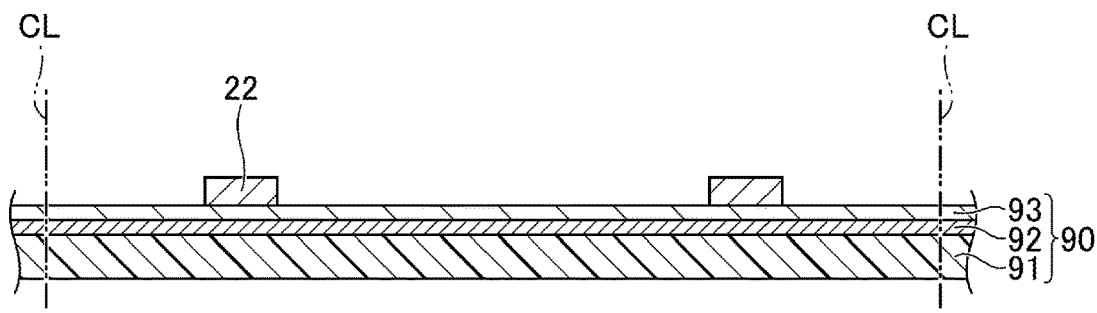

Next, as illustrated in FIG. 2E, the plating resist layer 80 is removed.

Figure 2F:
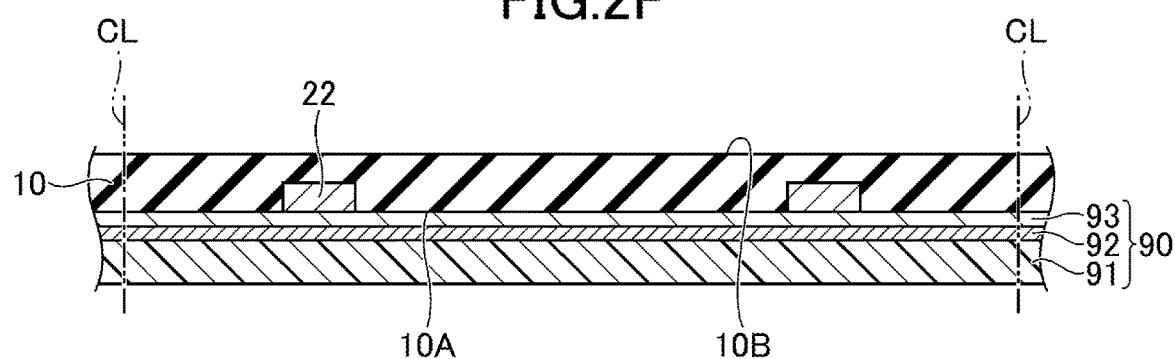

Thereafter, as illustrated in FIG. 2F, an uncured resin film is so applied on the upper surface of the copper foil 93 as to cover the second pads 22. Thereafter, this resin film is heated and cured to form the first insulating layer 10. The first insulating layer 10 has the first surface 10A (lower surface) and the second surface 10B (upper surface). The first insulating layer 10 is famed of an insulating resin such as epoxy resin or polyimide resin. The first insulating layer 10 may alternatively be formed by applying liquid resin.

Figure 2G:
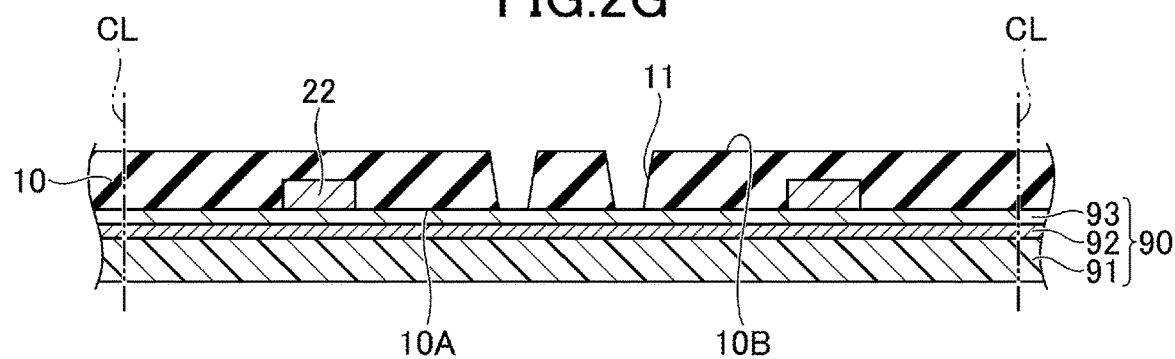

Next, as illustrated in FIG. 2G, laser processing is performed on the first insulating layer 10 to form the first via holes 11 that reach the copper foil 93 in the first insulating layer 10. For example, the first via holes 11 are approximately 50 μm to approximately 80 μm in diameter.

Figure 2H:
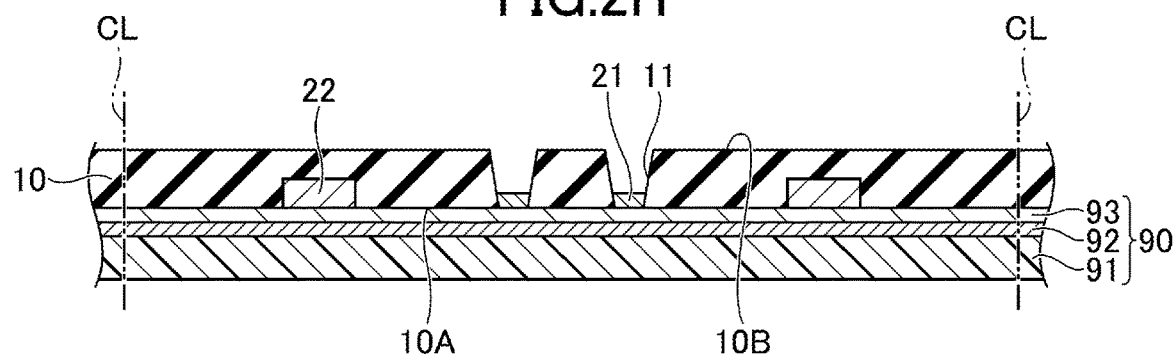

Next, as illustrated in FIG. 2H, the first pads 21 are formed on the upper surface of the copper foil 93 exposed in the first via holes 11. In forming the first pads 21, a gold film is formed on the copper foil 93, a palladium film is formed on the gold film, and a nickel film is formed on the palladium film. The temperature of an electroless plating solution used for forming the first pads 21 is, for example, approximately 70° C. to approximately 90° C. In general, a plating resist layer easily dissolves in an electroless plating solution of approximately 70° C. to approximately 90° C. According to this embodiment, however, there is no plating resist layer during electroless plating. Therefore, according to this embodiment, it is possible to avoid a decrease in yield, etc., due to the dissolution of a plating resist layer. For example, the first pads 21 are approximately 3 μm to approximately 5 μm in total thickness. The first pads 21 are equal in diameter to the first via holes 11.

Figure 2I:
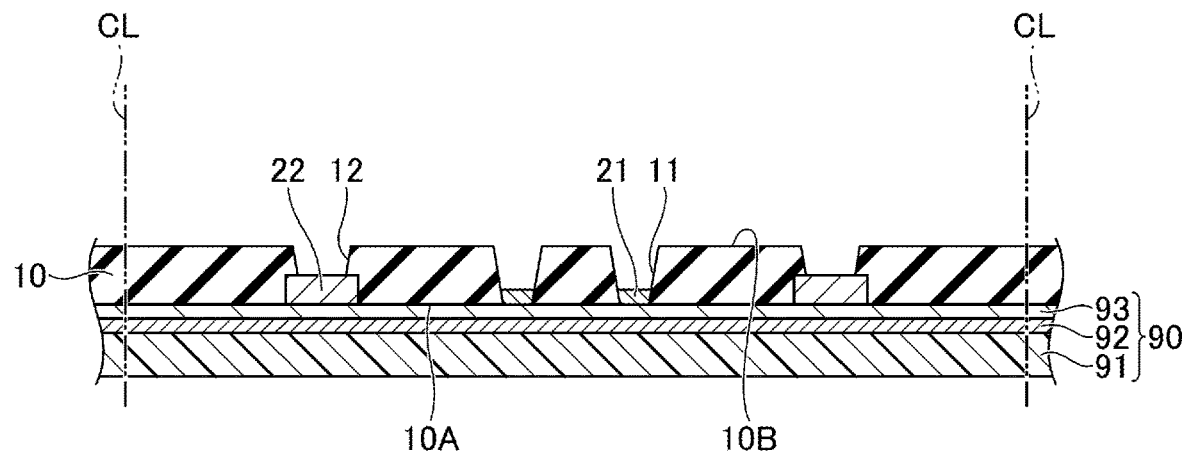

Thereafter, as illustrated in FIG. 2I, laser processing is performed on the first insulating layer 10 to form the second via holes 12 that reach the second pads 22 in the first insulating layer 10. For example, the second via holes 12 are approximately 50 μm to approximately 80 μm in diameter.

Figure 2J:
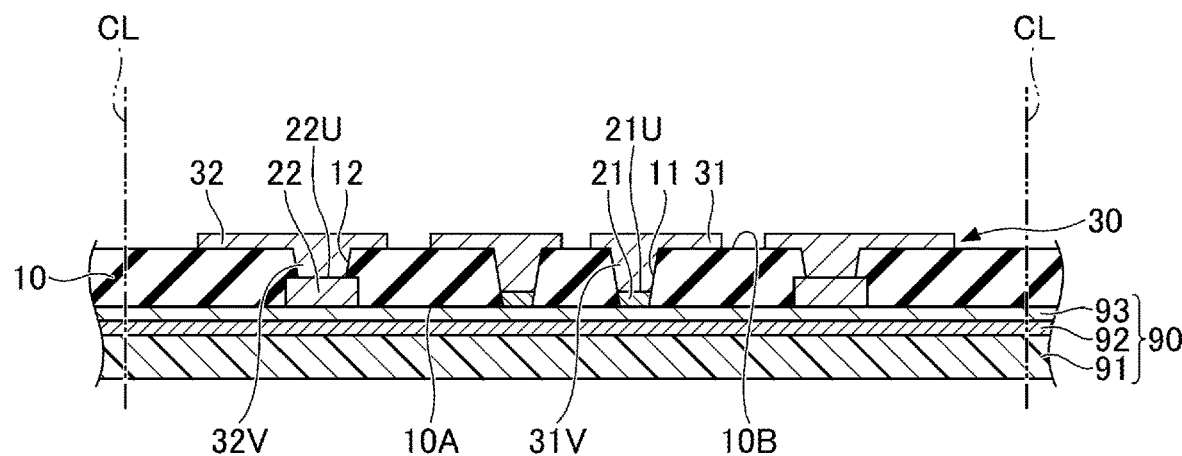

Next, as illustrated in FIG. 2J, the first wiring layer 30 is formed on the first insulating layer 10. The first wiring layer 30 includes the first wiring part 31, which is connected to the first pads 21 through the first via conductors 31V in the first via holes 11, and the second wiring part 32, which is connected to the second pads 22 through the second via conductors 32V in the second via holes 12. The entirety of the upper surface 21U of each first pad 21 contacts the first wiring part 31. Part of the upper surface 22U of each second pad 22 contacts the second wiring part 32.

The first wiring layer 30 may be formed using a semi-additive process. Here, a method of forming the first wiring layer 30 is described in detail. First, a seed layer of copper or the like (not depicted) is formed on the upper surface of the first insulating layer 10, the inside surfaces of the first via holes 11, and the inside surfaces of the second via holes 12 by electroless plating or sputtering. Next, a plating resist layer (not depicted) in which opening are provided where the first wiring layer 30 is to be formed is formed on the seed layer. Next, a metal plating layer of copper or the like is formed in the openings of the plating resist layer by electroplating using the seed layer as a power supply channel for plating. Thereafter, the plating resist layer is removed. Next, the seed layer is removed by wet etching, using the metal plating layer as a mask. In this manner, the first wiring layer 30 including the seed layer and the metal plating layer may be famed. For simplification of the drawing, the first wiring layer 30 is depicted as a one-piece structure of the seed layer and the metal plating layer.

Figure 2K:
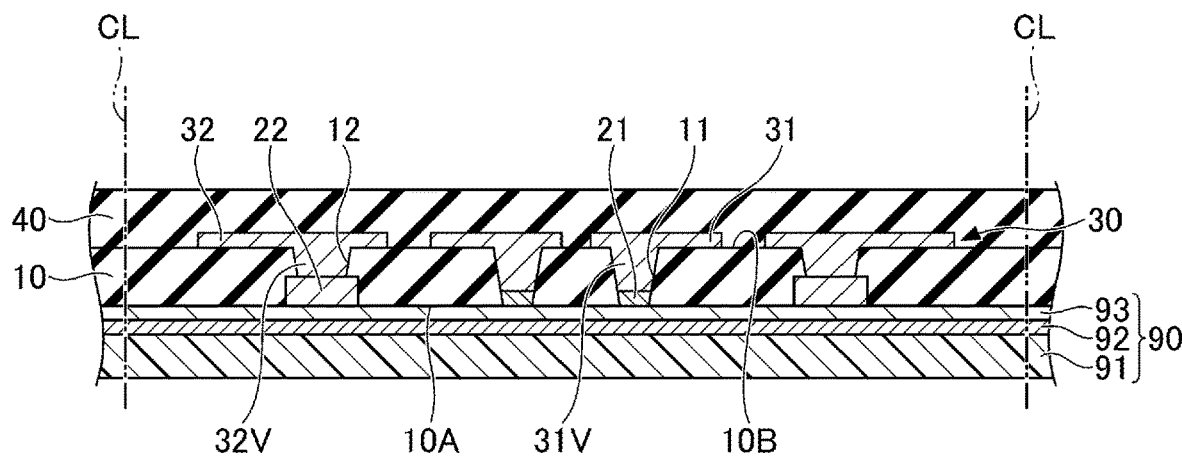

After the formation of the first wiring layer 30, as illustrated in FIG. 2K, the second insulating layer 40 is so formed on the first insulating layer 10 as to cover the first wiring layer 30. The second insulating layer 40 may be formed in the same manner as the first insulating layer 10.

Figure 2L:
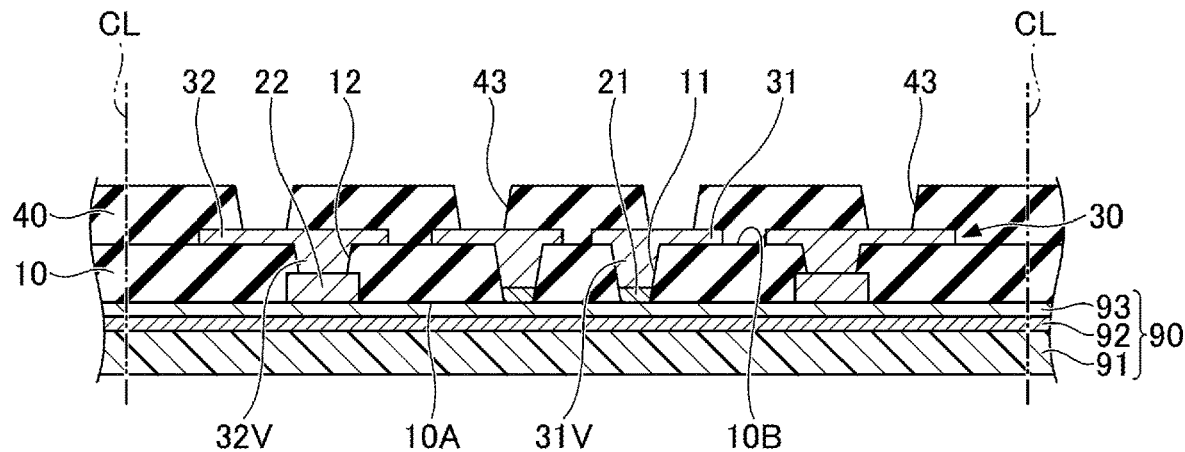

Next, as illustrated in FIG. 2L, laser processing is performed on the second insulating layer 40 to form the third via holes 43 that reach the connecting portion of the first wiring layer 30 in the second insulating layer 40. The third via holes 43 may be formed in the same manner as the first via holes 11.

Figure 2M:
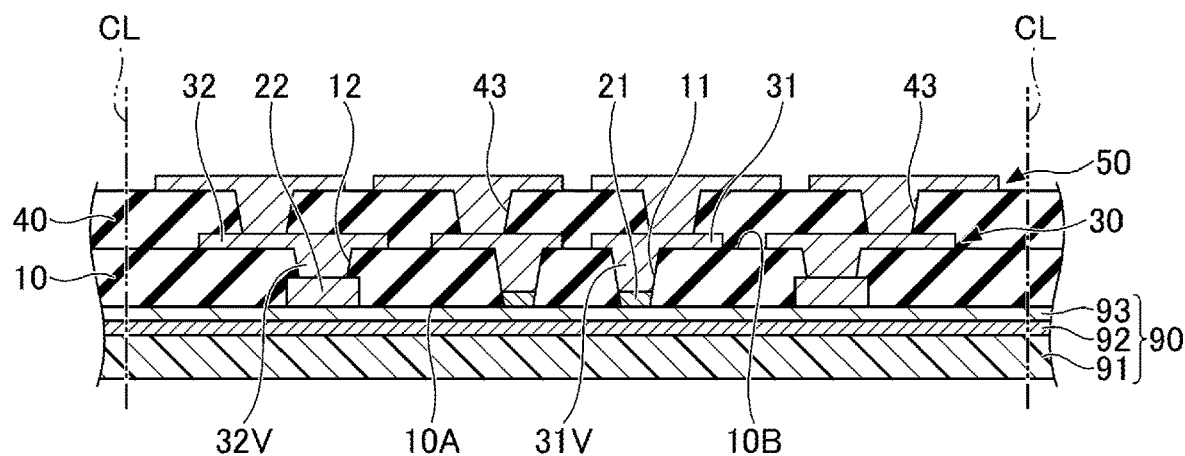

Thereafter, as illustrated in FIG. 2M, the second wiring layer 50 connected to the first wiring layer 30 through the via conductors in the third via holes 43 is formed on the second insulating layer 40. The second wiring layer 50 may be formed in the same manner as the first wiring layer 30.

Figure 2N:
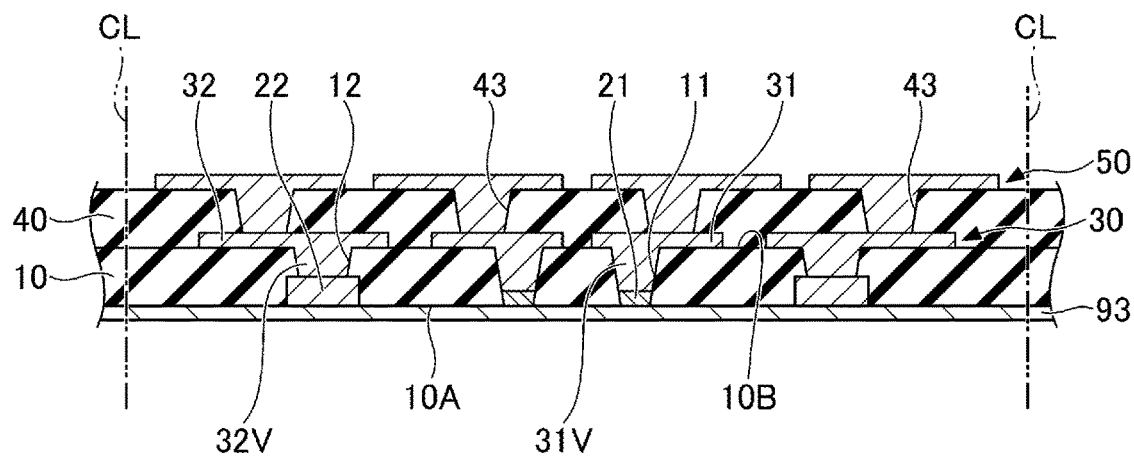

Next, as illustrated in FIG. 2N, the copper foil 93 and the carrier copper foil 92 are separated from each other to remove the carrier copper foil 92 and the base 91.

Figure 2O:
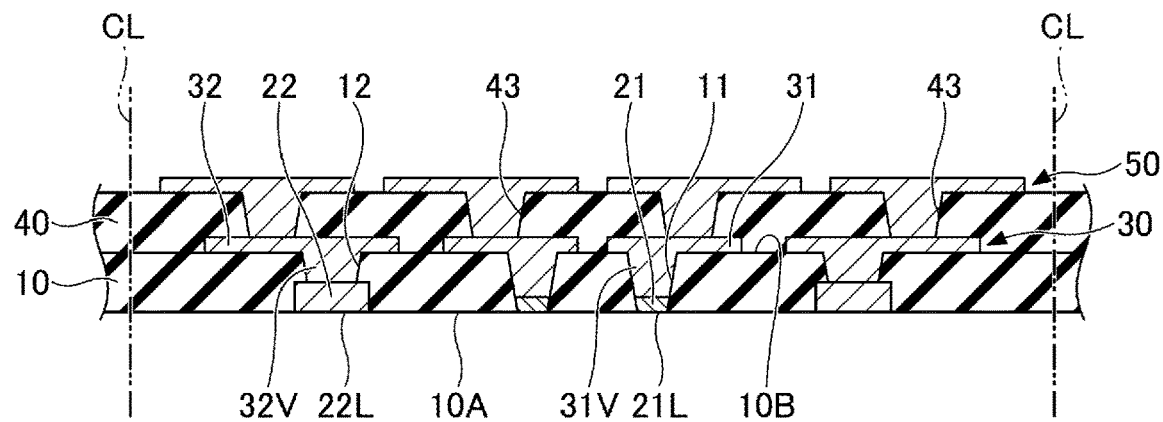

Next, as illustrated in FIG. 2O, the copper foil 93 is removed. The copper foil 93 may be removed by, for example, wet etching. As a result, the lower surface (the first surface 10A) of the first insulating layer 10, the lower surfaces 21L of the first pads 21, and the lower surfaces 22L of the second pads 22 are exposed.

Figure 2P:
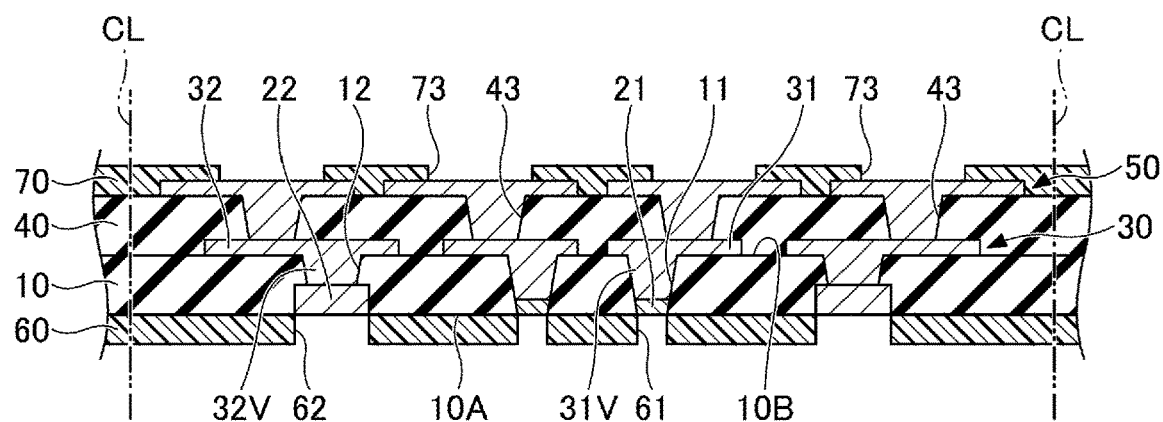
Figure 2Q:
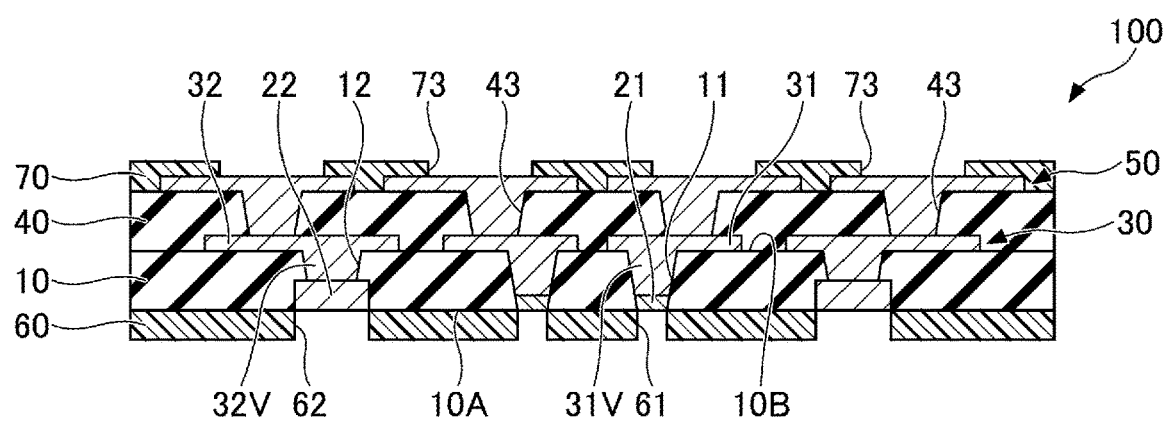

Thereafter, as illustrated in FIG. 2P, the solder resist layer 60 is formed on the lower surface (the first surface 10A) of the first insulating layer 10, and the solder resist layer 70 is formed on the upper surface of the second insulating layer 40. The first openings 61 that reach the first pads 21 and the second openings 62 that reach the second pads 22 are formed in the solder resist layer 60, and the third openings 73 that reach the connecting portion of the second wiring layer 50 are formed in the solder resist layer 70.

The solder resist layers 60 and 70 are formed of an insulating resin such as photosensitive epoxy resin or acrylic resin. The solder resist layers 60 and 70 may alternatively be formed by applying a resin film or applying liquid resin. The first openings 61, the second openings 62, and the third openings 73 may be formed by exposure to light and development. An insulating resin such as non-photosensitive epoxy resin or polyimide resin may be used as the solder resist layers 60 and 70. In this case, the first openings 61, the second openings 62, and the third openings 73 may be formed by laser processing or blasting.

Thereafter, as illustrated in FIG. 2Q, the structure illustrated in FIG. 2P is cut along the cutting lines Cl using a slicer or the like. As a result, structures corresponding to wiring substrates 100 are separated into individual pieces, so that multiple wiring substrates 100 according to the first embodiment can be obtained. In this manner, the wiring substrate 100 according to the first embodiment can be manufactured.

According to the first embodiment, the first pads 21 can be provided in the first via holes 11, formed by performing laser processing on the first insulating layer 10, in a self-aligning manner. Suppose that via holes are so famed using a laser as to reach the first pads 21 after forming the first pads 21. In this case, the first pads 21 need to be formed in a size with a margin in view of the misalignment of laser light. In contrast, according to this embodiment, because no such margin is necessary, the first pads 21 can be microfabricated with high accuracy.

Furthermore, the material of the part of the first pads 21 exposed at the first surface 10A may differ from the material of the part of the second pads 22 exposed at the first surface 10A. Therefore, these materials may be selected according to the use of the first pads 21 and the use of the second pads 22. For example, when the first pads 21 are used for the flip chip bonding of a semiconductor device and the second pads 22 are used for the wire bonding of the semiconductor device, the material of the lower surfaces 21L of the first pads 21 may be gold and the material of the lower surfaces 22L of the second pads 22 may be copper. Furthermore, anti-oxidation treatment such as organic solderability preservative (OSP) may be provided on the lower surfaces 22L of the second pads 22.

Furthermore, the first pads 21 can be formed by electroless plating without using a plating resist layer. In the case of forming a patterned electroless plating film using a plating resist layer, a decrease in yield, etc., due to the dissolution of the plating resist layer in a plating solution are caused. In contrast, according to this embodiment, because the first pads 21 are formed in the first via holes 11 formed in the first insulating layer 10, it is possible to microfabricate the first pads 21 with high accuracy while avoiding a decrease in yield, etc.

Furthermore, as illustrated in FIG. 2H, during the formation of the first pads 21, the first pads 21 are electrically at the same potential via the copper foil 93. Therefore, the first pads 21 are formed at substantially the same rate, so that there can be good uniformity in thickness among the first pads 21.

The first via holes 11 may be smaller in diameter than the second via holes 12. Furthermore, the first via holes 11 and the second via holes 12 may have a tapering sectional shape with the diameter decreasing from the second surface 10B side to the first surface 10A side. In this case, the diameter of each first via hole 11 is a diameter at the first surface 10A, and the diameter of each second via hole 12 is a diameter at its end on the first surface 10A side.

Furthermore, the planar shape of each pad and via hole does not have to be circular. The diameter of a pad or via hole whose planar shape is not a true circle may be substituted by an equivalent circle diameter.

Furthermore, according to the above-described manufacturing method, the support substrate 90 having the carrier copper foil 92 and the copper foil 93 formed on only one side of the base 91 is used to form the single-sided wiring substrate 100. The carrier copper foil 92 and the copper foil 93, however, may also be famed on the other side of the base 91 to form the double-sided wiring substrate 100.

[b] Second Embodiment

Figure 3:
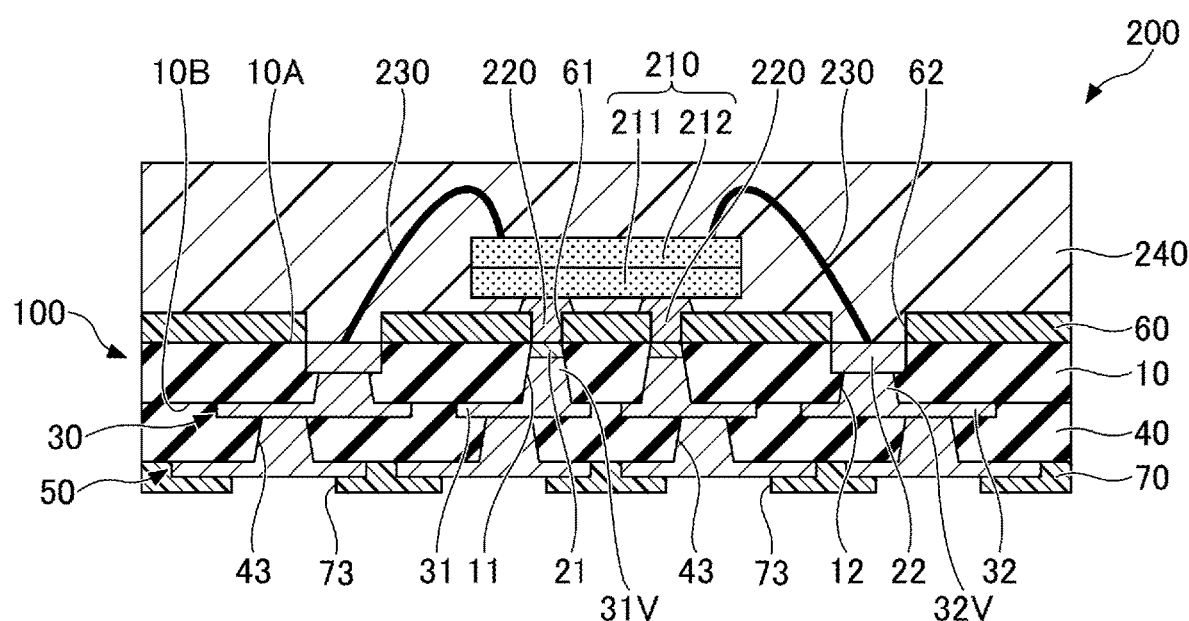
FIG. 3 is a sectional view of a semiconductor device according to a second embodiment.

Next, a second embodiment is described. The second embodiment relates to a semiconductor device. FIG. 3 is a sectional view of a semiconductor device according to the second embodiment. According to the second embodiment, the vertical orientation of the wiring substrate 100 is inverted relative to that in FIG. 1. Accordingly, the second embodiment is described with the vertical orientation inverted relative to that of the first embodiment.

As illustrated in FIG. 3, a semiconductor device 200 according to the second embodiment includes the wiring substrate 100 according to the first embodiment, a stacked semiconductor device (element) 210, bumps 220, bonding wires 230, and an encapsulating resin 240.

The stacked semiconductor device 210 includes a first semiconductor device (element) 211 and a second semiconductor device (element) 212. The first semiconductor device 211 is connected to the first pads 21 via the bumps 220. That is, the first semiconductor device 211 is mounted on the wiring substrate 100 by flip chip bonding. For example, solder bumps are used for the bumps 220. Examples of materials for solder bumps include lead-free solders such as tin-silver (Sn—Ag) alloys, tin-zinc (Sn—Zn) alloys, and tin-copper (Sn—Cu) alloys and lead-based solders such as lead-tin (Pb—Sn) alloys.

The second semiconductor device 212 is stacked on the first semiconductor device 211. External connection pads are formed on the upper surface of the second semiconductor device 212. These pads are connected to the second pads 22 by the bonding wires 230. The second pads 22, the bumps 220, the stacked semiconductor device 210, and the bonding wires 230 are encapsulated by the encapsulating resin 240 on the upper surface side of the solder resist layer 60.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

Various aspects of the subject matter described herein may be set out non-exhaustively in the following numbered clauses:

1. A method of manufacturing a wiring substrate, including:
forming an insulating layer on a support substrate;
forming a via hole in the insulating layer such that the via hole reaches the support substrate;
forming a pad on the support substrate exposed in the via hole by electroless plating; and
forming a wiring part connected to the pad through a via conductor in the via hole.
2. The method of manufacturing a wiring substrate of clause 1, further includes:
forming another pad on the support substrate by electroplating before forming the insulating layer;
forming another via hole in the insulating layer such that the other via hole reaches the other pad between forming the pad and forming the wiring part; and
forming another wiring part connected to the other pad through another via conductor in the other via hole.
3. The method of manufacturing a wiring substrate of clause 2, wherein the wiring part and the other wiring part are simultaneously formed.
4. The method of manufacturing a wiring substrate of clause 2, wherein a material of a surface of the pad facing the support substrate is different from a material of a surface of the other pad facing the support substrate.
5. The method of manufacturing a wiring substrate of clause 4, wherein
the material of the surface of the pad facing the support substrate is gold, and
the material of the surface of the other pad facing the support substrate is copper.

What is claimed is:

1. A wiring substrate comprising: an insulating layer; a pad in a via hole piercing through the insulating layer, the pad being exposed at a first surface of the insulating layer; a via conductor on the pad in the via hole; and a wiring part on a second surface of the insulating layer facing away from the first surface, the wiring part being connected to the pad through the via conductor in the via hole, wherein a diameter of the pad, a diameter of the via conductor, and a diameter of the via hole are equal to one another at an interface between the pad and the via conductor.

2. The wiring substrate as claimed in claim 1, wherein an entirety of a surface of the pad facing toward the wiring part is in contact with the via conductor.

3. The wiring substrate as claimed in claim 1, further comprising: another pad exposed at the first surface of the insulating layer; another via conductor in another via hole in the insulating layer, said another via hole extending from the second surface of the insulating layer to reach a surface of said another pad on a side opposite from the first surface of the insulating layer; and another wiring part on the second surface of the insulating layer, said another wiring part being connected to said another pad through said another via conductor in said another via hole.

4. The wiring substrate as claimed in claim 3, wherein a material of a part of the pad exposed at the first surface of the insulating layer is different from a material of a part of said another pad exposed at the first surface of the insulating layer.

5. The wiring substrate as claimed in claim 4, wherein the material of the exposed part of the pad is gold, and the material of the exposed part of said another pad is copper.

6. The wiring substrate as claimed in claim 3, wherein a diameter of said another pad is larger than the diameter of the pad.

7. The wiring substrate as claimed in claim 3, wherein said another pad is thicker than the pad.

8. The wiring substrate as claimed in claim 3, wherein a diameter of said another via conductor and a diameter of said another via hole are equal to each other at an interface between said another pad and said another via conductor.

9. The wiring substrate as claimed in claim 3, wherein a part of the surface of said another pad is in contact with said another via conductor, and a remaining part of the surface of said another pad is in contact with the insulating layer.

10. The wiring substrate as claimed in claim 3, wherein the diameter of the via hole is smaller than a diameter of said another via hole.

11. The wiring substrate as claimed in claim 1, wherein the pad has a surface exposed at the first surface of the insulating layer, the exposed surface being flush with the first surface.

12. The wiring substrate as claimed in claim 1, further comprising: a solder resist layer on the first surface of the insulating layer, wherein the pad is exposed in an opening in the solder resist layer.

13. The wiring substrate as claimed in claim 1, wherein the via hole has a first end and a second end at the first surface and the second surface, respectively, of the insulating layer, and the via hole decreases in diameter from the second end to the first end.

14. A semiconductor device comprising: the wiring substrate as set forth in claim 1; and a semiconductor element mounted on the wiring substrate by flip chip bonding and connected to the pad.

* * * * *